(12) United States Patent  (10) Patent No.: US 9,179,546 B2
Mundt et al.  (45) Date of Patent: Nov. 3, 2015

(54) BLIND VIA PRINTED CIRCUIT BOARD FABRICATION SUPPORTING PRESS FIT CONNECTORS

(71) Applicant: Dell Products L.P., Round Rock, TX (US)

(72) Inventors: Kevin W. Mundt, Austin, TX (US); Jason D. Adrian, Cedar Park, TX (US)

(73) Assignee: Dell Products L.P., Roud Rock, TX (US)

( * ) Notice: Subject to any disclaimer, the term of this patent is extended or adjusted under 35 U.S.C. 154(b) by 577 days.

(21) Appl. No.: 13/628,532

(22) Filed: Sep. 27, 2012

(65) Prior Publication Data

US 2014/0083754 A1  Mar. 27, 2014

(51) Int. Cl.
| H01K 3/10 | (2006.01) |
| H05K 1/11 | (2006.01) |
| H05K 3/00 | (2006.01) |
| H05K 3/42 | (2006.01) |
| H05K 3/30 | (2006.01) |
| H05K 3/46 | (2006.01) |
| H01R 12/58 | (2011.01) |

(52) U.S. Cl.
CPC .............. *H05K 1/115* (2013.01); *H05K 3/0047* (2013.01); *H05K 3/421* (2013.01); *H01R 12/585* (2013.01); *H05K 3/0094* (2013.01); *H05K 3/306* (2013.01); *H05K 3/4611* (2013.01); *H05K 2201/09509* (2013.01); *H05K 2201/09845* (2013.01); *H05K 2201/10189* (2013.01); *H05K 2201/10545* (2013.01); *H05K 2203/1476* (2013.01); *Y10T 29/49126* (2015.01)

(58) Field of Classification Search
CPC ..... H05K 1/115; H05K 3/0047; H05K 3/421; H05K 3/0094; H05K 3/306; H05K 2201/09509; H05K 2201/09845; H05K 2201/10189; H05K 2201/10545; H05K 2203/1476; H05K 3/4611; H01R 12/585; Y10T 29/49126
USPC ....... 29/831, 846; 156/156; 174/262; 216/41; 427/97.2
See application file for complete search history.

(56) References Cited

U.S. PATENT DOCUMENTS

| 4,975,142 | A | * | 12/1990 | Iannacone et al. | .............. 29/852 |
| 5,734,560 | A | * | 3/1998 | Kamperman et al. | ........ 174/262 |
| 5,827,386 | A | * | 10/1998 | Bhatt et al. | .................. 427/97.2 |
| 7,649,375 | B2 | | 1/2010 | Behziz et al. | |
| 2006/0180346 | A1 | | 8/2006 | Knight et al. | |

* cited by examiner

*Primary Examiner* — Donghai D Nguyen
(74) *Attorney, Agent, or Firm* — Terrile, Cannatti, Chambers & Holland, LLP; Robert W. Holland

(57) ABSTRACT

An information handling system circuit board interfaces storage device surface connectors and storage device controllers disposed on opposing sides by coupling a first circuit board portion having a controller press in connector to a second circuit board portion having plural surface connectors. The first and second circuit board portions couple to each other with an adhesive activated by curing. Resistant ink is printed over openings of the first circuit board portion where adhesive is applied in order to prevent the adhesive from flowing into the openings at or before the curing of the adhesive.

9 Claims, 6 Drawing Sheets

BLIND VIA PRINTED CIRCUIT BOARD FABRICATION SUPPORTING PRESS FIT CONNECTORS

BACKGROUND OF THE INVENTION

1. Field of the Invention

The present invention relates in general to the field of information handling system circuit boards, and more particularly to blind via printed circuit board fabrication supporting press fit connectors.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Server information handling systems often include a number of storage devices to store information, such as hard disk drives. For example, a server rack supports multiple server information handling systems disposed in multiple slots and interfaced with each other by a switch. Each of the server information handling systems in the rack has a printed circuit board (PCB) that interfaces components of the server information handling system, such as one more processors each disposed in a socket, random access memory, a chipset with BIOS and similar firmware, one or more network interface cards (NIC), a baseboard management controller (BMC) and one or more hard disk drives. By directly connecting hard disk drives to a server information handling system, access is provided to information stored at local hard disk drives in a rapid manner as compared with retrieval of information through the switch. For example, Serial attached SCSI (SAS) hard disk drive connectors at a PCB provide information transfer rates of 6 Gb/s with planned transfer rates of 12 Gb/s.

Server information handling systems that include storage devices typically have a mid-plane circuit board assembly for connectivity in an enclosure, such as a rack slot. Generally, when a server information handling system's primary function is service of storage requests, the hard disk drives or other persistent storage devices are placed at the front portion of the chassis that holds the server information handling system in the rack to provide ease of access in the event that a storage device needs replacement. One typical goal is for the front portion of the server information handling system mid-plane circuit board to have 100% utilization for supporting storage devices with a maximum storage device connector density and the rear portion of the mid-plane circuit board having an interface to the storage controllers. For instance, SAS surface mounted connectors extend outwards from the upper surface of the mid-plane circuit board to interface with storage devices and press fit connectors extend outwards from the lower surface of the mid-plane circuit board to interface with storage controllers. Press fit connectors provide high speed backplane connections with very high pin counts to interface with multiple storage devices through circuit board connections with multiple surface mounted connectors.

One difficulty with upper and lower surface connector configurations is that press fit connectors are inserted into relatively large through hole vias in the mid-plane circuit board. Due to the large pin count of the press fit connectors, large sections of the mid-plane circuit board have through holes formed to accept connectors of the connector pin fields. SAS surface mount connectors located on the upper surface often coincide with the location of press fit connectors on the bottom surface. In order to co-locate storage device and press fit connectors, two mid-plane circuit boards are assembled in a sandwich configuration so that one mid-plane circuit board accepts the press fit connectors and the other mid-plane circuit board accepts the storage device surface mounted connectors. The two separate mid-plane circuit boards are then connected to each other with another set of press fit backplane connectors that avoid co-location with the first set of press fit connectors and the storage device surface mounted connectors. However, including a second set of press fit connectors to interface the two mid-plane circuit boards increases the cost of the system and introduces signal integrity issues that further increase manufacture costs. For example, back-drilling of press fit connectors vias eliminates stubs from assembly but increase manufacture steps and cost.

SUMMARY OF THE INVENTION

Therefore a need has arisen for a system and method which supports press fit connectors and surface mounted connectors assembled to opposing sides of a circuit board.

In accordance with the present invention, a system and method are provided which substantially reduce the disadvantages and problems associated with previous methods and systems for colocation of press fit connectors and surface mounted connectors at opposing sides of a circuit board. A counter bore opening in the bottom of a blind via that passes plating fluid through during manufacture of a first circuit board portion is covered by a blocking material to prevent fluids from entering the blind via through the opening during lamination of a second circuit board portion to the first circuit board portion over the opening.

More specifically, an information handling system motherboard with a storage device controller interfaces to a storage device circuit board through a press in connector coupled to the storage device circuit board. The press in connector communicates signals from the storage device controller through the circuit board to a surface connector that couples with a storage device. In order to provide freedom of placement of the surface connector and press in connector on opposing sides of the storage device circuit board, such as colocation on opposite sides, the storage device circuit board is assembled from first and second circuit board portions. The first portion has blind vias formed with a small diameter opening in the bottom of each blind via that allows plating fluid to pass through. After plating of the blind vias with conductive material, the openings in the bottom of the blind vias are blocked with a blocking material, such as by printing ink across the openings. The blocking material prevents adhesive used to couple the first and second portions together from entering into the blind vias during lamination of the first and second portions to each other. The ink printed on the first circuit board portion to block the openings has a viscosity that covers the openings but does not add significantly to the thickness of the circuit board portion. After lamination of the first and second portions to each other, interconnects are formed to interface wirelines disposed in the first and second portions so that the press in connector interfaces a storage device controller with plural storage devices coupled to plural storage device surface connectors.

The present invention provides a number of important technical advantages. One example of an important technical advantage is that press fit connectors and surface mounted connectors are collocated on opposing sides of a circuit board to provide efficient use of space within an information handling system enclosure for supporting storage devices. Integrating press fit connectors and surface mounted connectors to a common circuit board for interfacing storage devices with storage controllers reduces signal integrity issues to support high speed information communication, such as 12 Gb/s SAS interfaces. Laminating two circuit boards together provides reduced cost of assembly of an information handling system since fewer parts are involved in the assembly, better signal integrity since signals are transferred through circuit board without intermediary connectors and reduced circuit board costs with simplified manufacture.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Blind vias of an information handling system circuit board accept a press in connector and a surface connector collocated on opposing surfaces. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
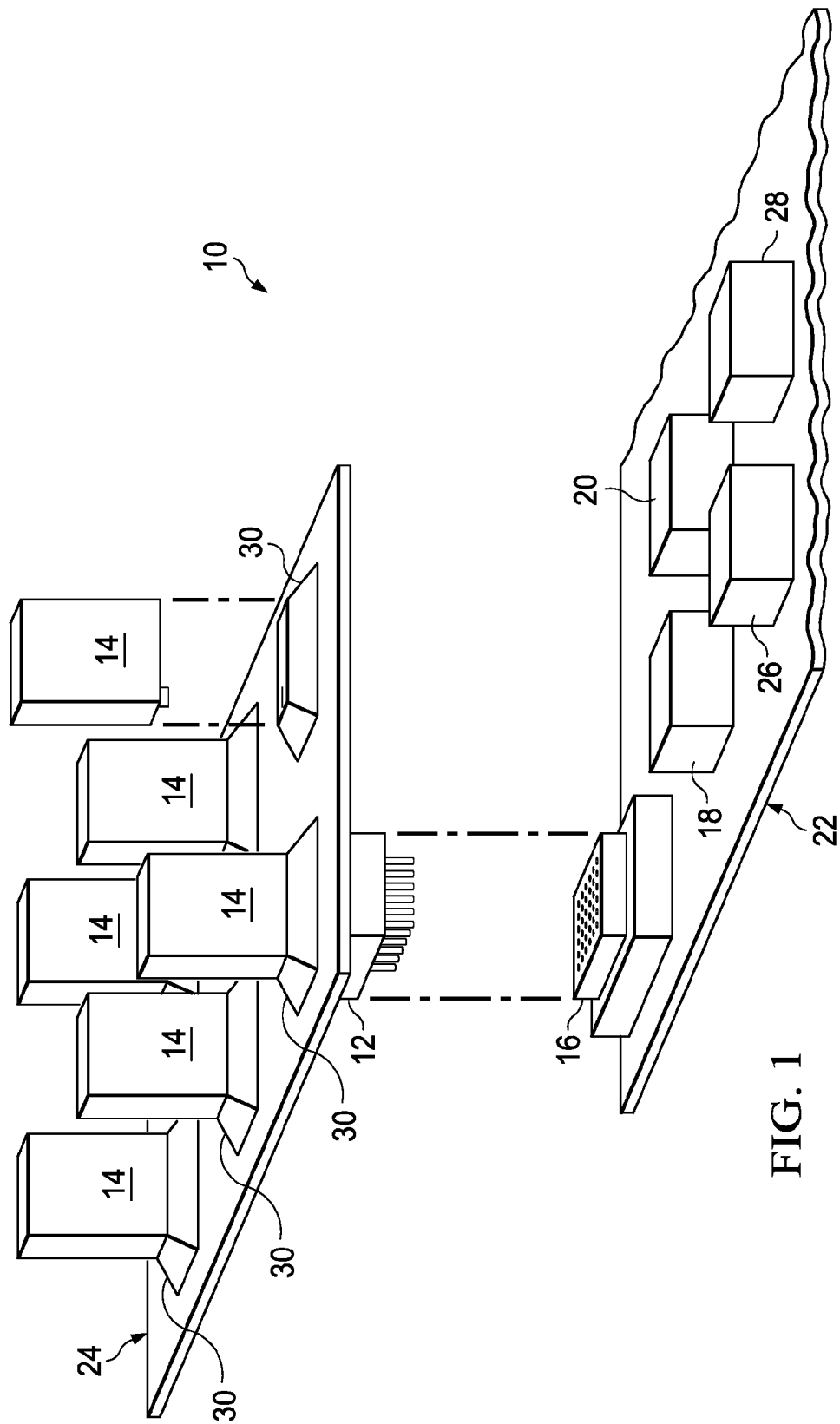
FIG. 1 depicts a server information handling system having a press in connector that interfaces plural storage devices to a storage controller.

Referring now to FIG. 1, a server information handling system 10 is depicted having a press in connector 12 that interfaces plural storage devices 14 to a storage controller 16. Information handling system 10 processes information with a CPU 18 that executes instructions and random access memory (RAM) 20 that stores the instructions. In the example embodiment, information handling system 10 provides a storage server function by interfacing a motherboard 22 supporting storage device controller 16 with a storage device circuit board 24 supporting plural storage devices 14, such as hard disk drives, through press in connector 12. For example, a network interface card (NIC) 26 receives requests to access storage devices 14 from a client information handling system through a network. Firmware running on a chipset 28 manages communication of the requests through motherboard 22 for action by CPU 18. Access to storage devices 14 is handled by storage device controller 16 with communications sent through press in connector 12, storage device circuit board 24, a storage device surface connector 30 and a storage device 14. Storage device controller 16 controls access to plural storage devices 14. To provide communication between storage device controller 16 and plural storage devices 14, press in connector 12 has a high density of pins pressed into circuit board 24.

Storage device circuit board 24 has a relatively great thickness due the layer count needed to route signals between multiple storage devices 14 and storage device controller 16, and also to provide rigidity for mechanical support of storage devices 14 and press in connector 12. Storage devices 14 interface to the upper surface of circuit board 24 by coupling to surface connectors 30, such as SAS surface connectors. Press in connector 12 extends from the lower surface opposite surface connectors 30. Press in connector 12 for providing high speed communication with storage device controller 16 is a press fit type of connector that couples into hole vias for pin insertion. Surface connectors 30 also sometimes use hole mounted vias for insertion into circuit board 24. Since one goal for server information handling system 10 is a minimal footprint, surface area constraints can lead to colocation of surface connectors 30 and press in connector 12 on opposing surfaces of circuit board 24. In order to provide a thicker circuit board 24 that supports colocation of press in connector 12 and one or more surface connectors 30 on opposing surfaces, press in connector 30 inserts into blind vias of a first portion of circuit board 24 that is coupled to a second portion of circuit board 24 during manufacture of circuit board 24. Since blind vias for accepting press in connector 12 at a bottom surface of circuit board 24 do not protrude through the upper surface of circuit board 24, the pin field of press in connector 12 does not interfere with surface connectors 30 or the pin fields that support surface connectors 30.

Figure 2:
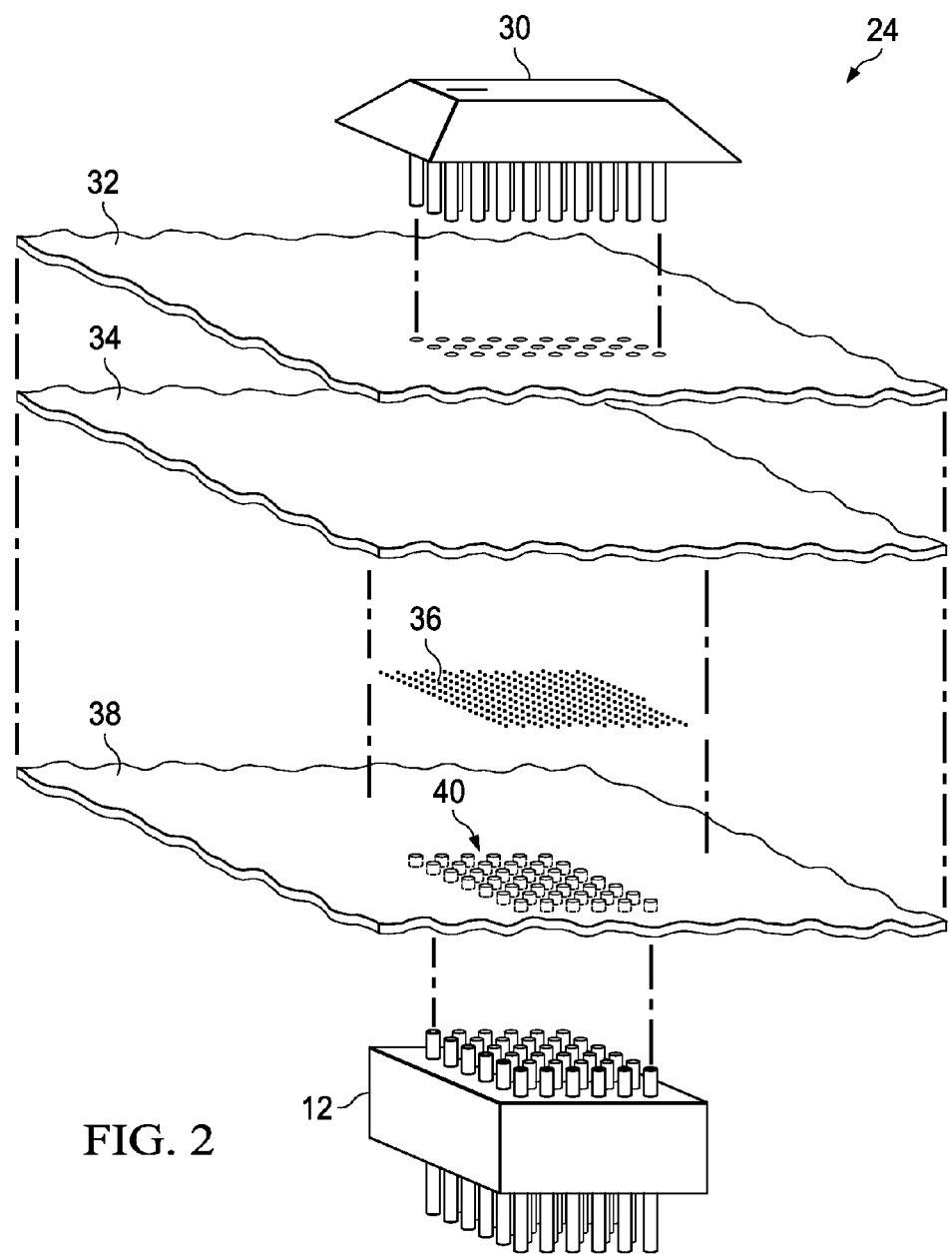
FIG. 2 depicts a side blown-up view of a circuit board assembly for interfacing storage device surface connectors and press in connectors.

Referring now to FIG. 2, a side blown-up view depicts a circuit board 24 assembly for interfacing storage device surface connectors 30 and press in connectors 12. Circuit board 24 is assembled from a storage device circuit board portion 32 and a press in connector circuit board portion 38. An adhesive 34 is applied between portions 32 and 38 to couple the portions together in a lamination process, such as with a pre-preg resin that is activated to form a hardened plastic. In order to prevent adhesive 34 from entering vias 40 formed in press in connector circuit board portion 38, a blocking material 36 having resistive characteristics, such as a UV activated ink or an epoxy ink, is applied over vias 40 before adhesive 34 is applied. Press in connector 12 inserts into vias 40 to a depth less than the thickness of press in connector circuit board portion 38 so that wirelines formed in portion 38 do not interfere with wirelines formed in storage device circuit board portion 32 to support storage device surface connectors 30. The wirelines of portions 32 and 38 are then interfaced with each other by drilling vias after portions 32 and 38 are coupled with each other. Because the connections for press in connector 12 and storage device surface connector 30 are in separate portions of circuit board 24, press in connector 12 can collocate on an opposing side of a surface connector 30 without introducing undue complexity to circuit board 24 and with management signal interference.

Figure 3:
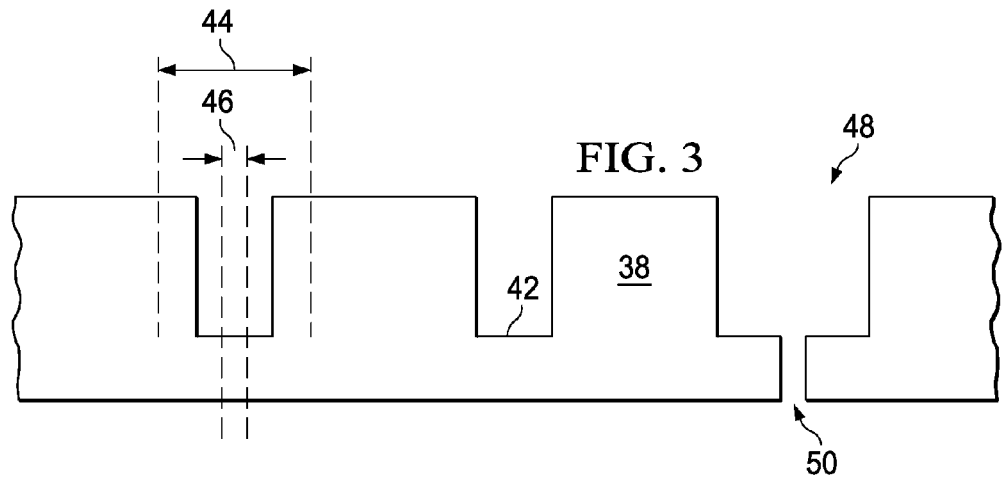
FIG. 3 depicts a side cutaway view of a circuit board manufactured to provide press in connector blind vias.

Referring now to FIG. 3, a side cutaway view depicts a circuit board 38 manufactured to provide press in connector blind vias. Circuit board portion 38 is initially manufactured with lamination formed blind vias 42 using multiple laminations to form blind via 42 with an aspect rations suitable for use with press in connector, such as a 10:1 aspect ratio in which the depth of blind via 42 is ten times greater than its width. Controlled depth drilling may also be used in some embodiments to form initial blind vias 42, however, controlled depth drilling is limited in that the vias are plated in copper with an electro plating process having a general guideline of a 1:1 aspect ratios that will not typically work with press in connectors. The use of a blind via means that the thickness of circuit board portion 38 is greater than the depth to which the pins of press in connector 12 enter so that the bottom surface of circuit board portion 38 can remain solid without any openings.

In order to pass plating fluid through blind via 42, an opening is formed with a counter bore drilling process. A larger diameter first drill width 44 is drilled in each blind via 42 with a controlled depth drill to approximately the depth to which connector pins will insert. A second smaller drill width 46 is then concentrically drilled down the first hole through the thickness of circuit board portion 38. The finished press in connector via opening 48 thus includes an opening 50 at the lower surface of portion 38 that will allow plating fluids to pass through for plating via 48 with conductive material. The aspect ratio of 10:1 is met for the lower surface opening 50 to provide passage of the plating fluid, however, the diameter of lower surface opening 50 can vary as desired to adjust to the viscosity of a blocking material disposed over opening 50 as set forth below. Although the description set forth for FIG. 3 starts with a lamination formed blind via 42, in alternative embodiments, counter bore drilling may be performed on an unformed circuit board material as permitted by the connector pin insertion depth. In alternative embodiments, the counter bore drilling process may be avoided where the blocking material is viscous enough or the via small enough that the blocking material spans the hole associated with the main via. In such a situation, one via hole is formed with a constant depth through the thickness of circuit board portion 38 and then covered by the blocking material. The use and size of a smaller counter bored opening depends upon the viscosity of the blocking material.

Figure 4:
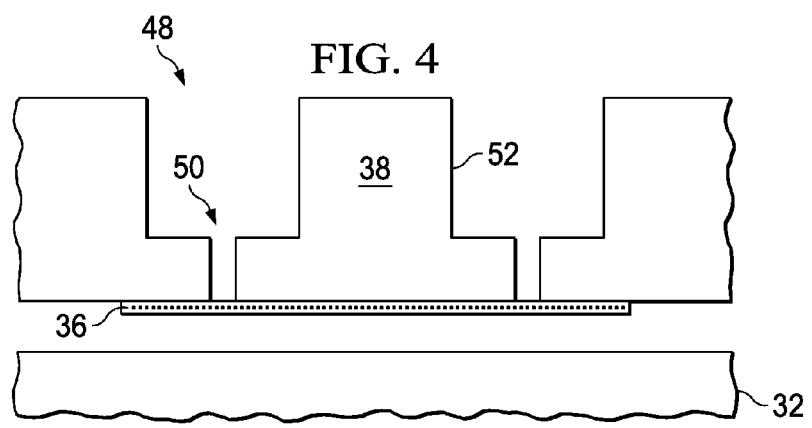
FIG. 4 depicts a side cutaway view of a circuit board with press in connector blind vias prepared to couple with a second circuit board section.

Referring now to FIG. 4, a side cutaway view depicts a circuit board 38 with press in connector blind vias 48 prepared to couple with a second circuit board section 32. Finished press in connector via opening 48 has a conductive material 52 deposited with plating fluids that flow through openings 50. After completion of the plating process, ink 36 is printed over openings 50 to block the openings from allowing adhesive to enter during lamination of circuit board portion 32 to circuit board portion 38. The viscosity of ink 36 is selected to have a value that will cover openings 50 without ink 36 adding excessive thickness to the circuit board lamination. The size of opening 50 determines the viscosity of the ink 36 so that a low enough viscosity is used to avoid adding excessive thickness while a high enough viscosity will provide sufficient blocking of opening 50. In various embodiments, various diameters for opening 50 may be used to have a large enough diameter to ensure adequate plating fluid passage, such as with a 10:1 aspect ratio, while also having as small a diameter as possible to obtain coverage of openings 50 with blocking material, such as printed ink, that does not add excessive thickness to the circuit board laminations.

Figure 5:
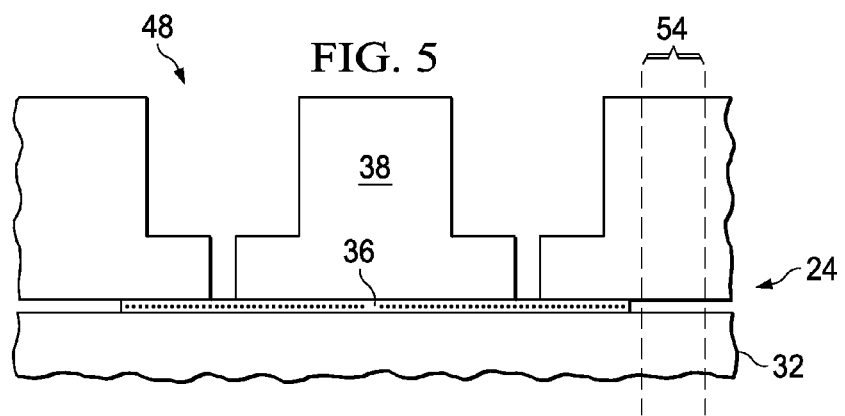
FIG. 5 depicts a side cutaway view of a circuit board with press in connector blind vias assembled to a surface connector circuit board portion.
Figure 6:
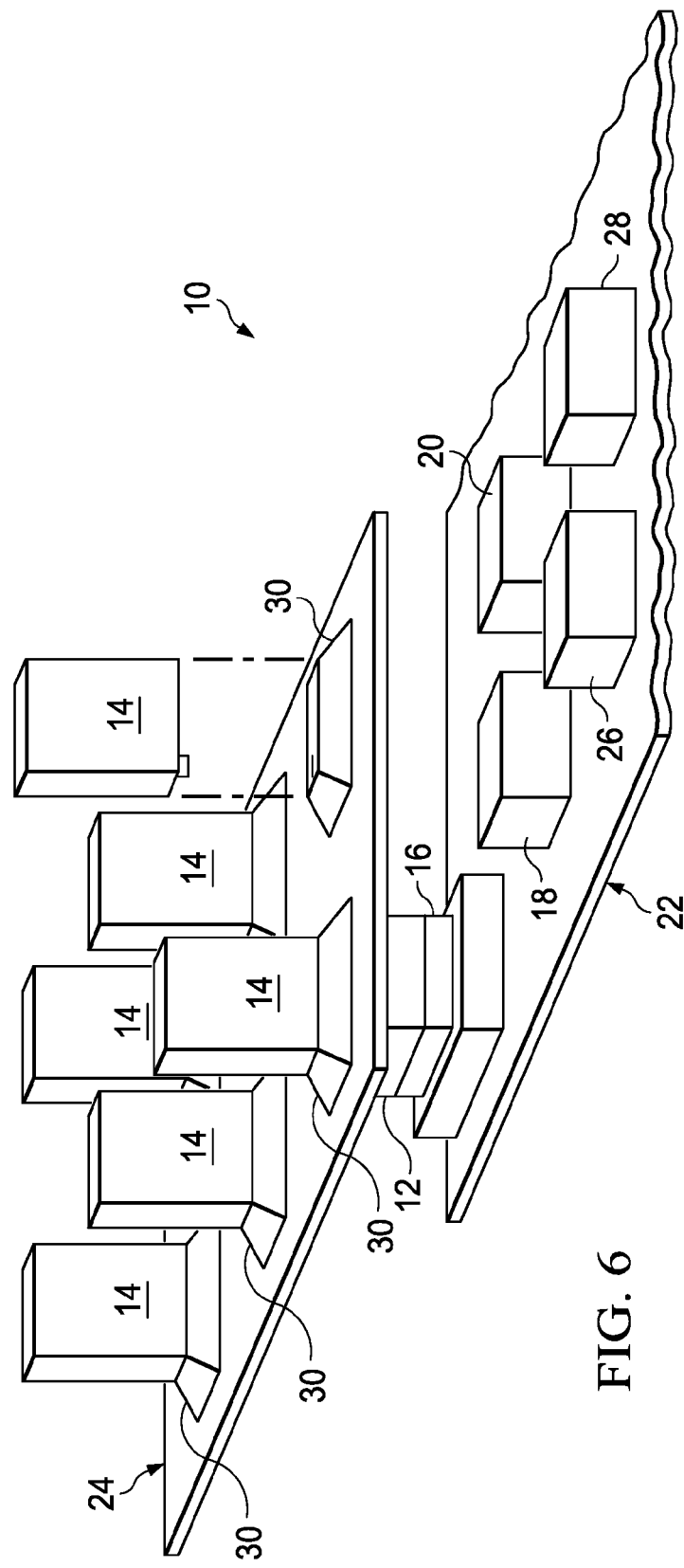
FIG. 6 depicts an assembled circuit board having a co-located press in connector and surface connector on opposing surfaces.

Referring now to FIG. 5, a side cutaway view depicts circuit board 38 with press in connector blind vias 48 assembled to a surface connector circuit board portion 32 to form a circuit board 24 for use in information handling system 10. Once press in connector circuit board portion 38 is coupled with storage device portion 32, circuit board portion interface openings 54 are drilled between portions 38 and 32 to form interconnects that interface press in connector 12 and surface connectors 30. Referring now to FIG. 6, an assembled circuit board 24 is depicted having a co-located press in connector 12 and surface connector 30 on opposing surfaces of circuit board 24. Colocation of press in connectors 12 and surface connectors 30 provides more efficient use of information handling system space and more flexibility in design of circuit board layout for supporting storage devices 14.

Figure 7:
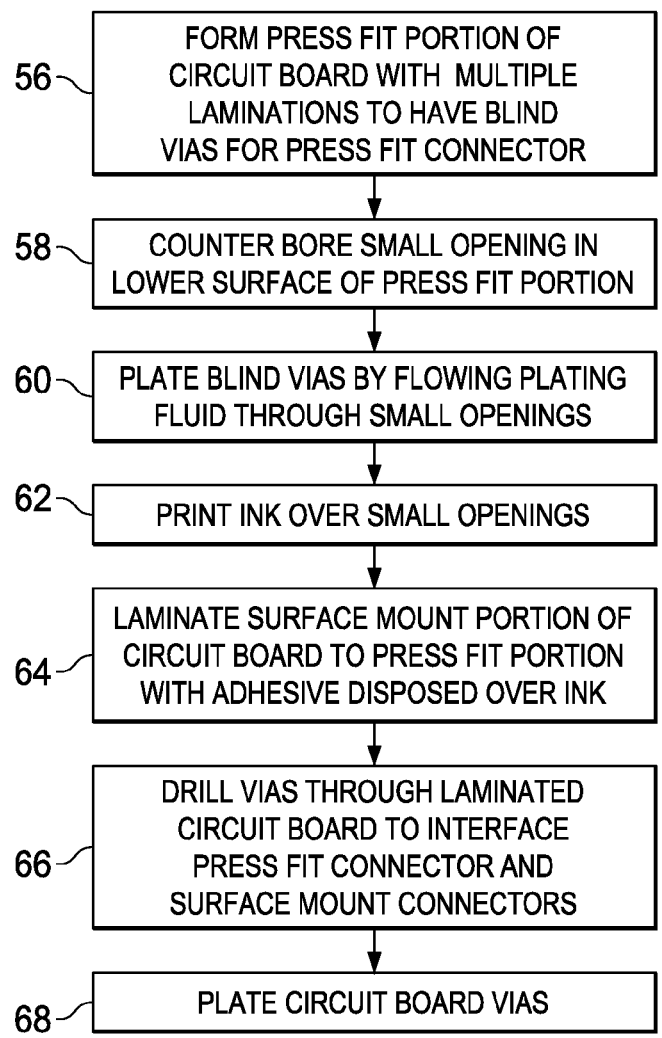
FIG. 7 depicts a flow diagram of a process for manufacture of a circuit board having a co-located press in connector and surface connector on opposing surfaces.
Figure 8:
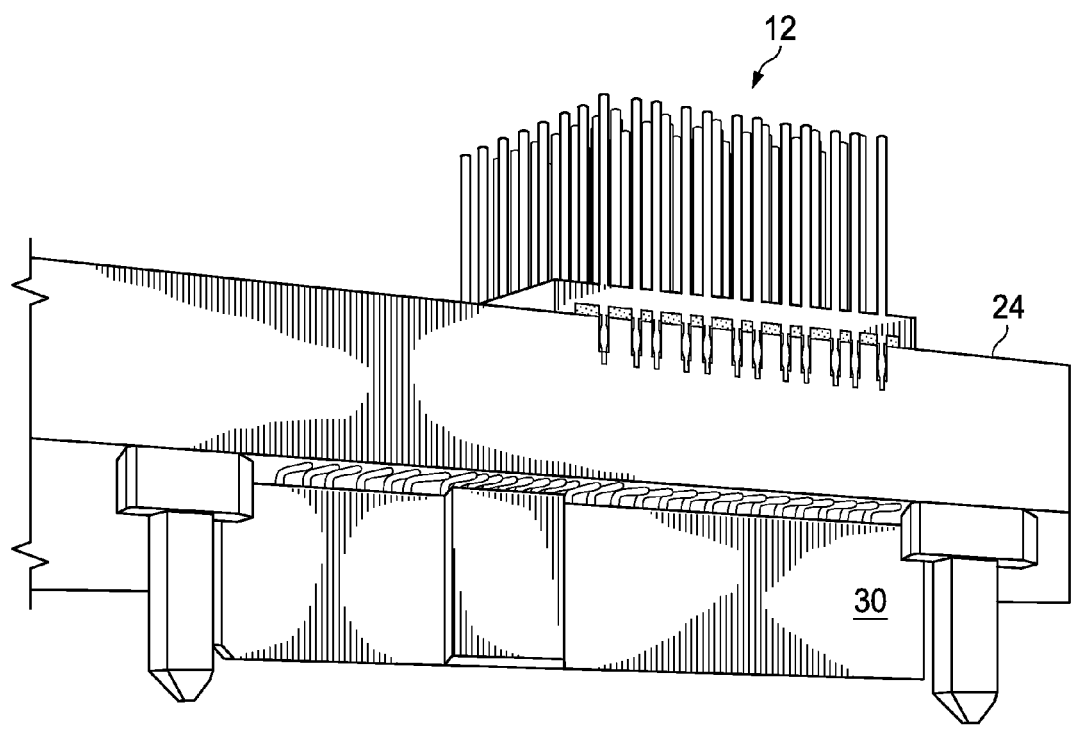
FIG. 8 depicts a side-view of a press in connector interfaced with a circuit board.

Referring now to FIG. 7, a flow diagram depicts a process for manufacture of a circuit board having a co-located press in connector and surface connector on opposing surfaces. The process begins at step 56 by forming a press in connector circuit board portion using multiple laminations to have blind vias for accepting a press fit connector. At step 58, two holes are drilled for each blind via with a counter bore drill process that leaves a blind via opening large enough to accept a press in connector pin and a through opening having a smaller diameter that has sufficient diameter to allow plating fluid to pass. At step 60, the blind vias are plated by flowing plating fluid through the small openings. Once the blind vias are plated with conductive material, the process continues to step 62 to print ink over the small openings so that the small opening are blocked from allowing adhesive to flow into the blind via. The viscosity of the ink used to print over the small openings provides complete blocking without having the ink flow into the blind vias. The ink has resistive properties to prevent conduction of signals through the ink between blind vias. For example, the ink is a UV activated or epoxy ink. At step 64, the surface mount circuit board portion is laminated to the press in connector circuit board portion over the ink and small diameter openings by applying an adhesive over the ink, clamping the portions together and activating the adhesive, such as with heat. At step 66, vias are drilled through the laminate portions to form interconnects for communicating signals between the surface connectors and the press in connectors. At step 68, the interconnects are plated and the assembled circuit board is prepared to accept a press in connector and surface connector couple on opposing sides and collocated over each other.

Although the present invention has been described in detail, it should be understood that various changes, substitutions and alterations can be made hereto without departing from the spirit and scope of the invention as defined by the appended claims.

What is claimed is:

1. A method for fabrication of a circuit board, the method comprising:
    forming blind vias at an upper surface of a first circuit board portion;
    drilling openings through the blind vias and lower surface of the first circuit board portion;
    flowing plating fluids through the blind vias and openings to plate the blind vias;
    disposing ink over the lower surface of the first circuit board portions to cover the openings;
    coupling a second circuit board portion at the lower surface of the first circuit board portion; and
    drilling vias through the first and second circuit board portions to support an interface between the first and second portions.

2. The method of claim 1 wherein coupling a second circuit board portion at the lower surface of the first circuit board portion further comprises:
    disposing an adhesive between the first circuit board portion and the second circuit board portion; and
    activating the adhesive;
    wherein the ink prevents adhesive from entering the lower surface openings.

3. The method of claim 1 wherein disposing ink further comprises printing an epoxy ink over the lower surface openings.

4. The method of claim 1 wherein disposing ink further comprises printing a UV cured ink over the lower surfaces.

5. The method of claim 1 wherein drilling openings through the blind vias for each blind via further comprises:
    control depth drilling a control depth opening having a depth and width adequate to accept a press fit connector pin and not through the first circuit board portion; and
    drilling the opening through the first circuit board portion to the lower surface with a width less than the control depth drilling.

6. The method of claim 5 wherein the opening to the lower surface has a width adequate to flow through plating fluids.

7. The method of claim 1 further comprising inserting a press fit connector into the blind vias.

8. The method of claim 7 further comprising coupling storage device surface mount connectors to the second circuit board portion.

9. The method of claim 8 further comprising interfacing the press fit connector and plural surface mount connectors through wires disposed in the vias drilled between the first and second circuit board portions.

* * * * *